United States Patent [19]

Hertz et al.

[11] Patent Number: 5,137,683
[45] Date of Patent: Aug. 11, 1992

[54] PROCESS FOR FORMING A CHROMIUM OXIDE INSULATING LAYER BETWEEN THE PELLETS AND THE CLADDING OF A NUCLEAR FUEL ELEMENT, AND FUEL ELEMENT HAVING SUCH AN INSULATING LAYER

[75] Inventors: Dominique Hertz, Tassin-La-Demi-Lune; Sylvain Audisio, Caluire; Francoise Defoort; Hassan Idrissi, both of Lyons, all of France

[73] Assignees: Framatome, Courbevoie; Cogema, Villacoublay, both of France

[21] Appl. No.: 554,856

[22] Filed: Jul. 20, 1990

[30] Foreign Application Priority Data

Jul. 21, 1989 [FR] France ............... 89 09891

[51] Int. Cl.$^5$ ............................................. G21C 3/00
[52] U.S. Cl. ............................... 376/416; 376/414; 376/409
[58] Field of Search ............ 376/416, 414, 409, 422; 427/6; 148/277

[56] References Cited

U.S. PATENT DOCUMENTS

| | | | |
|---|---|---|---|
| 3,184,393 | 5/1965 | Blomeyer et al. | 376/416 |
| 3,359,176 | 12/1967 | Antill | 376/416 |
| 3,494,785 | 2/1970 | Barr et al. | 427/6 |
| 3,852,098 | 12/1974 | Bloss et al. | 117/106 R |
| 4,297,150 | 10/1981 | Foster et al. | 148/276 |
| 4,735,852 | 4/1988 | Osada | 428/336 |

FOREIGN PATENT DOCUMENTS 0055459 7/1982 European Pat. Off.
0194748 9/1986 European Pat. Off.
1556428 7/1969 France.

OTHER PUBLICATIONS

"Color characteristics of pyrolytic metal oxide films".

*Primary Examiner*—Brooks H. Hunt
*Assistant Examiner*—Meena Chelliah
*Attorney, Agent, or Firm*—Pollock, Vande Sande & Priddy

[57] ABSTRACT

An organometallic chromium compound in the gaseous phase is brought into contact with a substrate consisting of the inner surface of the zirconium alloy tubular cladding (5) of the fuel element, or the outer surface of the pellets of fuel material, the substrate being kept at a temperature between 300° and 600° C. The organo metallic compound may consist of chromium acetylacetonate. The process enables a chromium oxide coating to be obtained inside the tubular cladding (5) and/or on the outer surface of the nuclear fuel pellets. Pellet/cladding interaction is thus prevented or limited when this fuel element is used in the reactor.

11 Claims, 3 Drawing Sheets

PROCESS FOR FORMING A CHROMIUM OXIDE INSULATING LAYER BETWEEN THE PELLETS AND THE CLADDING OF A NUCLEAR FUEL ELEMENT, AND FUEL ELEMENT HAVING SUCH AN INSULATING LAYER

FIELD OF THE INVENTION

The invention relates to a process for producing a chromium oxide insulating layer between the pellets and the cladding of a fuel element of a water-cooled nuclear reactor, and a fuel element having such an insulating layer.

BACKGROUND OF THE INVENTION

Fuel elements for water-cooled nuclear reactors generally consist of sintered uranium or plutonium oxide pellets stacked inside a tubular cladding made from an alloy such as Zircaloy 2 or Zircaloy 4' which are zirconium-based alloys containing tin.

The cladding of the fuel element, among other things, enables direct contact to be prevented between the coolant of the reactor and the sintered fuel pellets.

The cladding material must therefore resist corrosion by the coolant which, in the case of pressurized-water nuclear reactors, consists of water containing various chemical additives, and must also resist a temperature of the order of 315° C. and pressure of 155 bar. The cladding material must also have a low neutron absorption capacity.

Moreover, the sintered nuclear fuel pellets undergo various transformations when irradiated, in particular an expansion which may be responsible for a high contact pressure between certain fuel pellets and the inner surface of the cladding. The cladding is consequently subjected to mechanical stresses and is exposed to corrosive products created during the transformation of the fuel under irradiation, in the contact zones between the cladding and the pellets. These phenomena taken as a whole are generally referred to as pellet/cladding interaction (PCI).

In order to limit damage to the cladding caused by pellet/cladding interaction, it has been proposed to produce the cladding in a composite form such that it has an inner layer insulating the zirconium alloy tube from the fuel pellets.

Such a process is expensive and difficult to implement.

It has also been proposed to form various protective coatings inside the zirconium alloy cladding using conventional processes such as metal electroplating. These processes are difficult to implement in the case of tubes whose diameter is close to 9 mm and whose length is greater than 4 meters. Furthermore, the strength and efficiency of the coatings so formed more often than not prove to be insufficient when used in the environment of a nuclear reactor.

Coating-forming processes are also known, which processes are known under the name of chemical vapor deposition, or CVD. In the case where these processes are used for depositing a metal oxide layer onto a substrate, a volatile compound of the metal is brought into contact, in the presence of an oxidizing gas, with the substrate kept at a temperature permitting the in situ oxidation of the metal compound.

It has thus been proposed to deposit aluminum oxide, zirconium oxide, silica, or chromium or hafnium oxide using a halide, and generally a chloride, as the gaseous compound.

In order to implement these processes, it is generally necessary to keep the substrate at a high temperature of the order of 1000° C. This requirement may have certain disadvantages in the case of cladding tubes for nuclear reactor fuel elements because of the sensitivity of the zirconium to halides and because of the temperature which alters the metallurgical state of the base metal.

It has also been proposed to deposit iron, indium or tin oxide, or alternatively to deposit zirconium oxide using an organometallic compound as the gaseous compound. In this case, the substrate may be brought to a temperature considerably less than 1000° C.

In all cases, however, the depositing of oxide onto the substrate is a relatively slow process and the coating becomes extremely fragile as soon as the deposited layer exceeds a certain thickness, of the order of 1 to 2 microns.

It is therefore impossible to obtain, using the known processes of the prior art, deposits which are sufficiently thick and resistant to ensure effective protection against pellet/cladding interaction in the fuel elements of pressurized-water nuclear reactors.

Such deposits may advantageously consist of chromium oxide in the form of chromite $Cr_2O_3$.

Chemical vapor deposition processes using an organometallic compound are known which may be carried out at a moderate temperature considerably less than 1000° C. However, such processes have never been used to produce a chromium oxide insulating layer between the pellets and the cladding of a fuel element for a nuclear reactor.

SUMMARY OF THE INVENTION

The object of the invention is therefore to propose a process for producing a chromium oxide insulating layer between the pellets and the cladding of a fuel element for a nuclear reactor having a zirconium alloy cladding and a stack of pellets of sintered fuel material which are introduced into the cladding during the manufacture of the fuel element, this process enabling a thick and resistant insulating layer to be produced which separates the pellets from the cladding of the fuel element efficiently and permanently.

To this end, prior to filling the cladding with the pellets, an organometallic chromium compound is brought into contact, in gaseous form, with a substrate consisting of the inner surface of the cladding and/or the outer surface of the pellets, in the presence of an oxidizing gas, in order to produce chemical vapor deposition of chromium oxide on the substrate kept at a temperature between 300° and 600° C.

The organo metallic compound preferably consists of chromium acetylacetonate brought to a temperature of the order of 200° C. before it is brought into contact with the substrate, which enables a high partial pressure to be obtained of the compound in the gaseous phase.

BRIEF DESCRIPTION OF THE DRAWINGS

So that the invention may be readily understood, an embodiment of the process according to the invention will now be described by way of example and with reference to the attached drawings.

DETAILED DESCRIPTION

The substrate to be coated with chromium oxide consists of the inner surface of a zirconium alloy (Zircaloy 4) tube whose external diameter is 9.5 mm and whose length is greater than 4 meters.

Figure 1:
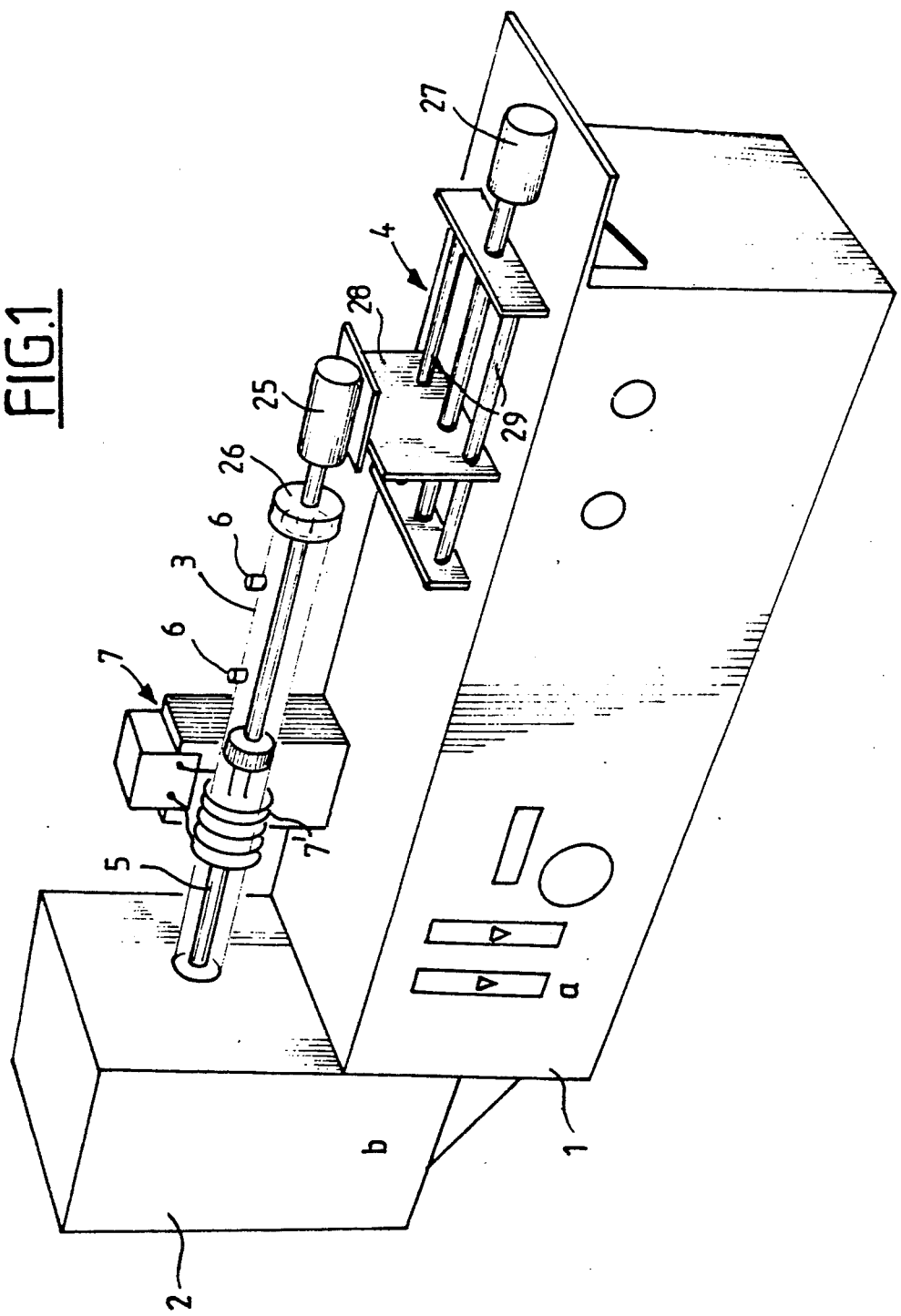
FIG. 1 is an overall perspective view of a device enabling the inner coating of a cladding tube for a fuel element to be produced.

As can be seen in FIG. 1, the device enabling the coating to be performed comprises a support and gas distribution unit 1, an oven 2 in which the vaporization and the maintaining of the temperature of the organo metallic chromium compound are realized, a reaction tube 3 made from refractory glass such as pyrex and a motorized unit 4 permitting the rotational and translational displacement of the Zircaloy tube 5 placed inside the pyrex reactor 3. Nozzles 6 enable the residual gases to be removed during the coating operation.

An induction-heating device 7 is placed on the support 1 and has a heating winding 7' surrounding the pyrex tube 3 over a certain length corresponding to the heating zone of the tube 5 during the coating operation.

Figure 2:
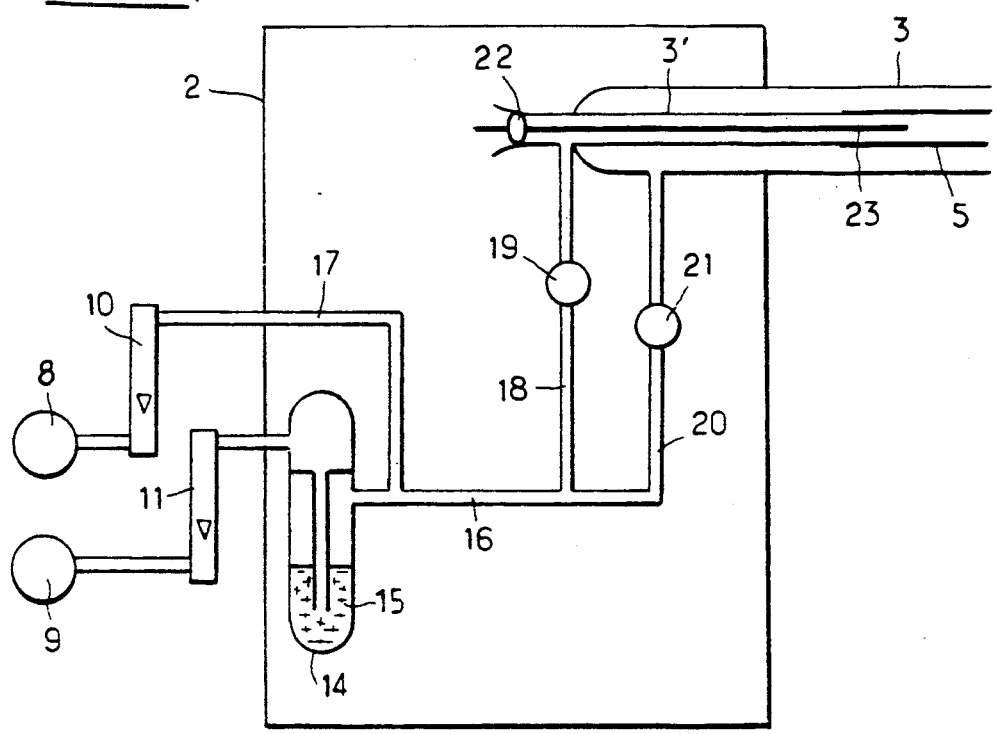
FIG. 2 is a schematic view showing the structure and the function in principle of the device shown in FIG. 1.

As can be seen in FIGS. 1 and 2, the support and gas-distribution unit 1 has an oxygen source 8, an argon source 9, ball flow meters 10 and 11 enabling the distribution and regulation of the oxygen and argon flow to be ensured, and connecting ducts.

The front face of the support and distribution unit 1 carries control and display means enabling the physical parameters of the coating operation to be adjusted and monitored.

In addition, inside the oven 2, the coating device has a bulb 14 containing the organometallic chromium compound 15 whose oxidation and thermal decomposition is performed. The bulb 14 is connected to the argon source 9 via the flow meter 11 and connecting ducts. The internal volume of the bulb 14, in which the vaporization of the organometallic compound 15 takes place, may thus be scavenged. The mixture of argon and vapor is removed through a duct 16 into which a certain flow of oxygen is sent from the source 8 via the flow meter 10 and a duct 17.

The mixture of argon, oxygen and organometallic compound vapor is sent into the pyrex tube 3 constituting the reactor containing the Zircaloy tube 5 either via a duct 18 or via a duct 20, depending on the open or closed condition of two valves 19 and 21 placed on the ducts 18 and 20, respectively. This gaseous mixture is entirely homogeneous, the chromium compound being wholly in the vapor form.

In the case where the valve 19 is open and the valve 21 closed, the gaseous mixture is sent via a pyrex tube 3' fixed inside the tube 3 in a coaxial and central arrangement and engaged inside the Zircaloy tube 5. A thermocouple 23 fixed on a stopper 22 closing the tube 3' and in the axis of this tube enables the temperature to be measured inside the Zircaloy tube 5 in the reaction zone heated by the induction winding 7'.

In this configuration, the design enables the inner coating of the tube 5 to be performed.

In the case where the valve 21 is open and the valve 19 closed, the gaseous mixture penetrates directly inside the casing of the pyrex tube 3 and comes into contact with the outer surface of a piece introduced into the tube 3. In this configuration, the device enables the outer coating of the fuel pellets, or optionally the tube 5, to be performed.

The unit 4 for displacing the tube 5 has a motor 25 whose output shaft passes tightly through a lid 26 closing the pyrex reactor tube and is connected to the Zircaloy tube 5 which is fixed in its extension. The motor 25 enables the Zircaloy tube 5 to be rotated about its axis so as to obtain a deposit of uniform thickness and composition.

The unit 4 also has a motor 27 connected to a screw and a nut system enabling a support 28 on which the motor 25 is fixed to be displaced. The support 28 is guided in axial translational movement by rods 29 fixed in the axial direction on the support unit 1.

The support 28 capable of axial translational movement is connected to the Zircaloy tube 5 via the motor 25 and its output shaft.

The motor 27 enables the Zircaloy tube 5 to be displaced translationally inside the pyrex reactor 3 so as to present successively the different zones of the tube along its length, at the level of the heating and reaction zone corresponding to the internal volume of the induction winding 7'.

In order to deposit chromium oxide $Cr_2O_3$ onto the inner (or outer) surface of a Zircaloy 4 tube, chromium acetylacetonate has been used as the organometallic compound.

Before introducing the Zircaloy 4 tube inside the pyrex reactor 3, the surfaces of this tube are carefully cleaned by chemical attack for thirty seconds in a bath containing hydrofluoric acid, nitric acid and water. The tube is subsequently rinsed with distilled water and then dried. The pickling enables the layer of zirconium oxide present on the tube to be removed, zirconium being a metal which can be passivated. The Zircaloy tubes may also be subjected to a mechanical polishing and then to a degreasing with acetone before being introduced into the reactor.

Scavenging with argon is then performed in the internal volume of the reactor before introducing therein the gaseous reaction mixture consisting of argon, oxygen, and chromium acetylacetonate vapor.

The chromium acetylacetonate introduced into the oven 2 is brought to a temperature of the order of 180° to 200° C. permitting its vaporization; this temperature furthermore enables any decomposition of the chromium acetylacetonate to be prevented.

Argon constituting the vector gas is sent into the capsule containing the chromium acetylacetonate vapor in order to entrain this vapor into the duct 16. A certain proportion of oxygen is added to the gaseous mixture by means of the flow meter 10 and the duct 17.

In the case where the valve 19 is open and the valve 21 closed, the gaseous mixture reaches as far as the inside of the Zircaloy tube 5, in the region of the heating zone formed by the induction winding 7'.

It is possible either for the induction winding 7' to be supplied with power prior to charging the reaction gas as soon as the argon scavenging has been performed, or for the winding 7' to be supplied with power only after the filling of the reactor tube 3 with the reaction mixture is complete.

In all cases, heating by induction has the advantage of giving rise to a release of heat actually inside the piece on which the treatment is being carried out and, in the present case, inside the wall of the tube 5. The reaction mixture is thus prevented from being heated to a temperature causing the decomposition and oxidization of the organometallic chromium compound, in a zone remote from the wall of the Zircaloy tube on which the coating is being made. In particular, decomposition and oxidization of the organometallic chromium compound when it enters the pyrex reactor tube 3 is in this way prevented.

Furthermore, heating by induction is very flexible and enables high heating speeds to be obtained.

In the case of a Zircaloy tube with an external diameter of 9.5 mm, a pyrex reactor tube with a diameter of 20 mm and an induction winding 7, with a length of 60 mm have been used; this length corresponds to the length of the reaction zone in which the coating is performed.

Figure 3:
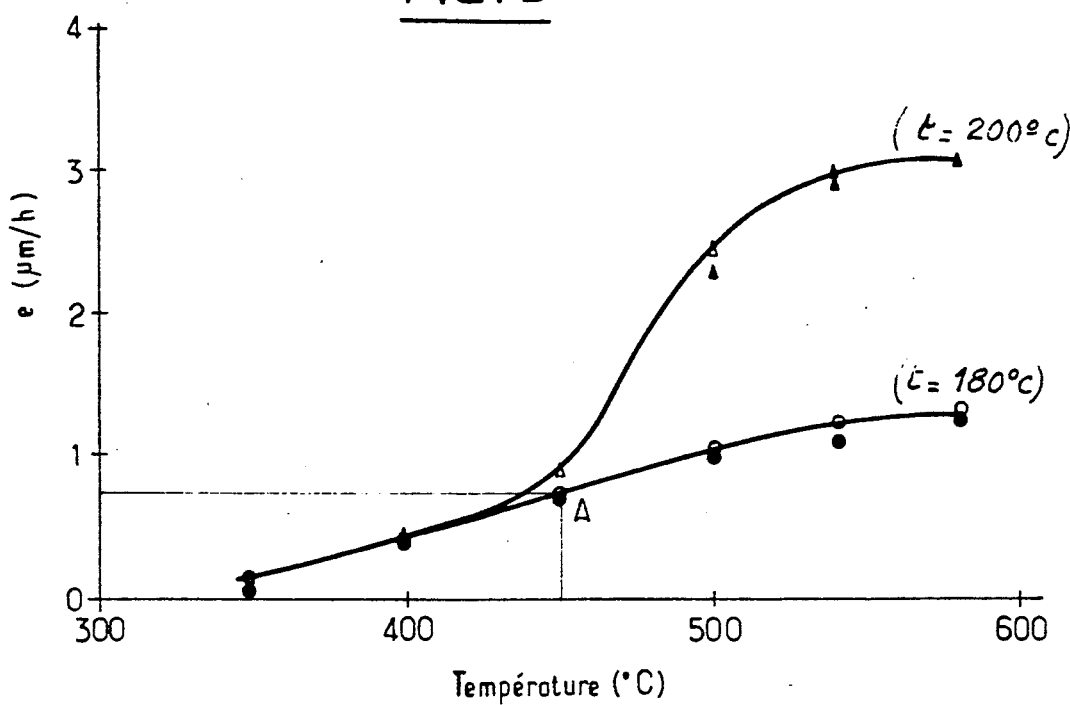
FIG. 3 is a diagram showing the variations in the speed of growth of the chromium oxide coating as a function of the temperature of the substrate and for two different temperatures of the chromium compound in vapor form.
Figure 4:
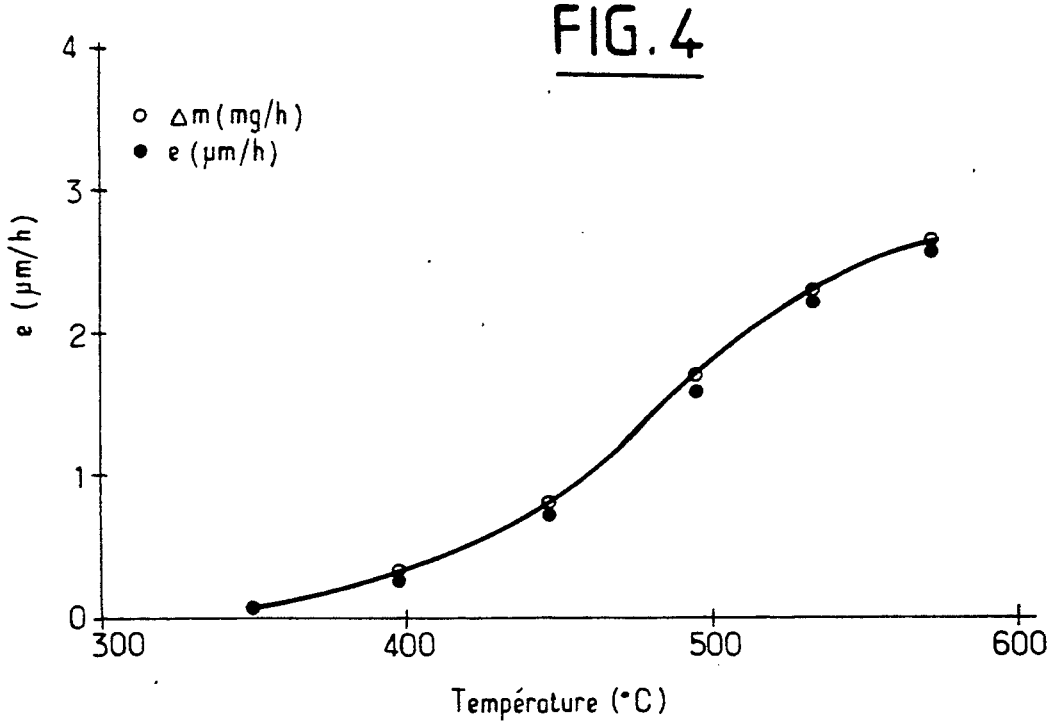
FIG. 4 is a diagram showing the variations in the speed of growth of the chromium oxide coating as a function of the temperature of the substrate and for a pressure below atmospheric pressure in the reaction chamber of the coating device.
Figure 5:
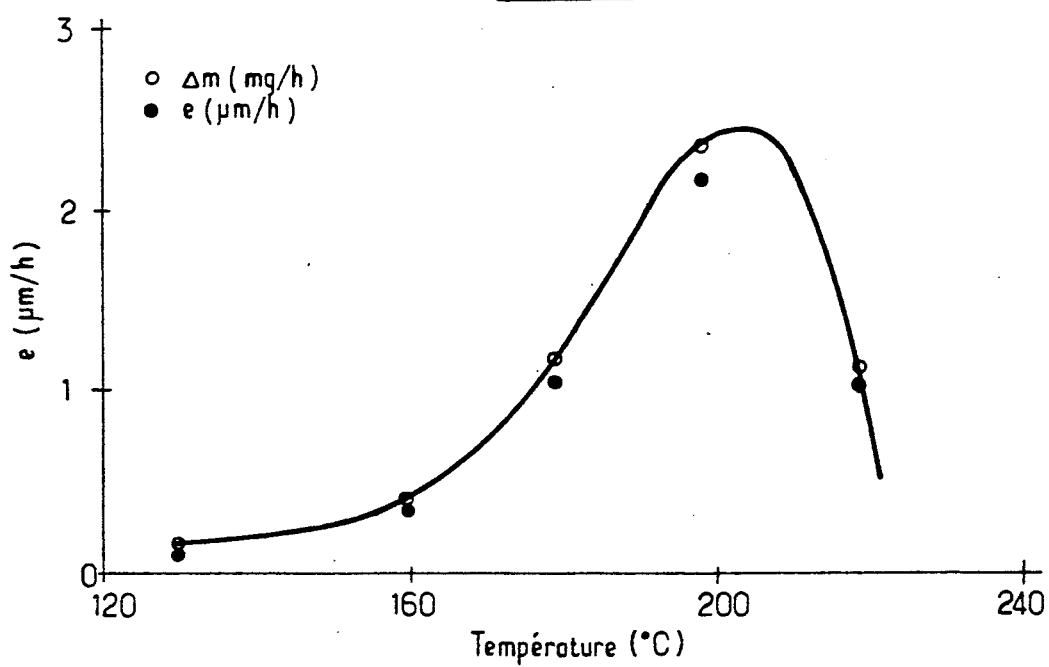
FIG. 5 is a diagram showing the variations in the speed of growth of the chromium oxide coating layer as a function of the temperature of the organometallic chromium compound.

As can be seen in FIGS. 3, 4 and 5, different coating operations have been performed inside a Zircaloy tube using chromium oxide $Cr_2O_3$, varying the operating conditions under which the decomposition and the oxidization of the chromium acetylacetonate $(C_5H_7O_2)_3$-Cr are carried out. Thermal decomposition of the chromium acetylacetonate gives rise to chromite $Cr_2O_3$ which is deposited in the form of a thick and uniform layer on the surface of the Zircaloy tube brought to the temperature permitting the thermal decomposition, by induction heating.

FIG. 3 is a diagram giving the variations in the speed of deposition of the chromium oxide $Cr_2O_3$ as a function of the temperature of the substrate, in other words the temperature of the internal surface of the Zircaloy tube, for two different vaporization and heating temperatures of the organometallic chromium compound.

The lower curve corresponds to a heating temperature of the chromium acetylacetonate inside the oven 2 of t=180° C.

The upper curve corresponds to a heating temperature of the chromium acetylacetonate of t=200° C.

In the case of the lower curve, the speed of deposition of the chromium oxide $Cr_2O_3$ coating goes from a virtually zero value for a temperature of the substrate of 350° C. to a value greater than 1 $\mu$m/h for a temperature of the substrate slightly below 600° C.

The upper curve indicates that the speed of deposition of the chromite $Cr_2O_3$ coating on the Zircaloy 4 goes from a virtually zero value for a temperature of the substrate of 350° C. to a value of the order of 3 $\mu$m/h for a temperature of the substrate slightly below 600° C.

FIG. 4 is a diagram showing the variations in the speed of deposition of the chromium oxide $Cr_2O_3$ coating, as a function of the temperature of the substrate, in the case where the pressure of the reaction mixture inside the reactor 3 is maintained at a value substantially less than atmospheric pressure.

In this case, the speed of growth of the chromium oxide layer goes from a virtually zero value for a temperature of the substrate of 350° C. to a value slightly below 3 $\mu$m/h for a temperature of the substrate slightly below 600° C.

FIG. 5 is a diagram showing the variations in the speed of deposition of the chromium oxide layer as a function of the temperature to which the chromium acetylacetonate is brought inside the oven 2.

The speed goes from a virtually zero value for a temperature of the chromium acetylacetonate of 120° C. to a maximum value above 2 $\mu$m/h for a value close to 200° C. The coating-formation speed then decreases very rapidly, which allows an optimum value to be determined for the heating temperature of the organometallic compound.

FIG. 5 is obtained for a temperature of the substrate close to 500° C.

The other parameters whose value must be determined in order to employ the coating process according to the invention are the carrier gas (argon) flow rate and the oxidizing gas (oxygen) flow rate.

Tests have been conducted for carrier gas (argon) flow rates ranging from 0 to 8 liters/hour and for oxidizing gas (oxygen) flow rates ranging from 0 to 6 liters/hour.

It has been possible to show that the ratio of the argon and oxygen ratio could vary within very large proportions, but the argon flow rate always remains considerably greater than the oxygen flow rate. This argon/oxygen ratio has, for example, been fixed at the value 30 in a first series of coating operations and at the value 4 in a second series of operations.

The speed of the translational movement of the Zircaloy tube inside the reactor is fixed at a value of a few centimeters/hour.

In all cases, the organo metallic chromium compound in the form of vapor is entrained by the current of argon and mixed with a certain proportion of oxygen. The reaction medium enters the reactor at a temperature which does not permit oxidization and pyrolysis of the chromium acetylacetonate.

When the reaction medium comes into contact with the zone of the Zircaloy tube brought by induction to a temperature very considerably greater than the temperature of the reaction mixture, however, oxidization, pyrolysis and $Cr_2O_3$ formation take place in contact with the Zircaloy wall. A thick, uniform and resistant chromium oxide $Cr_2O_3$ layer is deposited on this wall. This layer continues to grow over time at a speed dependent upon the operating conditions, as has been indicated above.

It is by all means possible to deposit a layer whose thickness is very considerably greater than 5 $\mu$m and less than 10 $\mu$m without this layer being fragile.

It has never been possible to obtain such a result using the processes according to the prior art.

By way of example, a coating has been made with a thickness slightly greater than 5 $\mu$m and less than 10 $\mu$m inside a Zircaloy tube under the following conditions:

temperature of the chromium acetylacetonate: 180° C., temperature of the substrate: 450° C., argon/oxygen ratio=30, speed of the translational movement of the tube: 3 to 5 cm/h.

In this case, the speed of growth of the deposit is 0.8 $\mu$m/h, which corresponds substantially to point A in the diagram in FIG. 3.

The deposit is uniform and adherent and consists of chromium oxide $Cr_2O_3$ with a hexagonal structure, as may be proved by X-ray diffraction and by Raman spectrometry. It has furthermore been possible to show the homogeneous composition in the thickness of the layer by fluorescent spectrometry.

It should be noted that the speed of deposition of the chromium oxide $Cr_2O_3$ coating depends equally on the features of the installation and on the depositing process. This speed depends, in particular, on the flow rate of the organometallic compound in vapor form, on the temperature of the reaction gases in contact with the substrate, and on the pressure of these gases (it has been possible to vary this pressure between 1 millibar and 1030 millibars).

It is also possible to influence the conditions of the deposition by introducing reducing gases into the reactor, such as hydrogen, these gases accelerating the decomposition of the organometallic compound used, and by employing a plasma producing activated species such as ions, atoms or free radicals.

Independently of these various influences beyond the conditions for implementing the process itself, it has been possible to determine optimum conditions for conducting the coating process.

These conditions may be defined thus: heating temperature for the organometallic compound: 190° to 200° C., temperature of the substrate: 500° to 600° C.,
vector gas (argon) flow rate: 4 liters/hour,
oxygen flow rate: 1 liter/hour.

These conditions are, of course, valid in the case of the internal coating of a Zircaloy cladding tube.

Under the above-defined conditions, the speed of deposition of the chromium oxide $Cr_2O_3$ coating layer is of the order of 1.5 μm/h.

In order to prevent pellet/cladding interaction of the fuel elements, a chromium oxide coating layer may be deposited on the outer lateral surface of the sintered nuclear fuel pellets over a thickness less than 10 μm using the above-described process and device. The pellets are then introduced into a zirconium alloy cladding which may or may not have an internal coating of a layer of chromium oxide.

In all cases, the chromium oxide layer deposited, either on the inner surface of the cladding or on the lateral surface of the pellets, or on both the cladding and the pellets, allows the fuel material to be efficiently and permanently separated from the cladding during the use of the fuel element in the reactor, which enables the pellet/cladding interaction phenomenon to be prevented.

It is clear that the process according to the invention is not limited to the embodiments which have been described.

It is thus possible to use volatile organo metallic compounds other than chromium acetylacetonate $(C_5H_7O_2)_3$-Cr, and for example compounds such as RCr carbonyl and chromium trichlorotetrahydrofuran.

It is clear that the oxidization of the organo metallic chromium compound may be obtained using an oxidizing gas other than oxygen, and for example using water vapor or carbon dioxide.

The fuel element claddings obtained using the process according to the invention may also have an outer anti-wear chromium oxide layer formed by chemical vapor deposition using an organometallic compound.

We claim:

1. A process for producing a chromium oxide insulating layer between pellets and a cladding (5) of a fuel element for a nuclear having a zirconium alloy cladding (5) and a stack of pellets of sintered fuel material which are introduced into the cladding (5) during manufacture of the fuel element, comprising the steps of bringing an organometallic chromium compound into contact, in gaseous form, with at least one substrate consisting of the inner surface of the cladding (5) and/or the outer surface of the fuel pellets, in the presence of an oxidizing gas, and maintaining said substrate at a temperature between 300° and 600° C. in order to produce chemical vapor deposition of chromium oxide.

2. The process as claimed in claim 1, wherein the organometallic chromium compound is chromium acetylacetonate $(C_5H_7O_2)_3$-Cr, and wherein the temperature of the substrate is between 350° and 600° C.

3. The process as claimed in claim 2, wherein the chromium acetylacetonate is heated to a temperature between 180° and 200° C. before being brought into contact with the substrate.

4. The process as claimed in claim 1, wherein the vapor of the organometallic chromium compound is entrained by a vector gas ensuring its contact with the substrate.

5. The process as claimed in claim 4, wherein the vector gas is argon.

6. The process as claimed in claim 4, wherein the oxidizing gas consists of oxygen mixed in a given proportion with the vector gas and with the organometallic compound vapor.

7. A fuel element for a nuclear reactor having a tubular zirconium alloy cladding (5) and a stack of pellets of sintered fuel material arranged inside the cladding (5), comprising at least one chromium oxide insulating layer less than 10 μm thick inserted between the inner surface of the cladding (5) and that outer surface of the pellets situated facing the inner surface of the cladding (5).

8. The fuel element as claimed in claim 7, wherein the insulating layer is deposited on the inner surface of the cladding (5).

9. Fuel element as claimed in claim 7, wherein the insulating layer is deposited on the outer surface of the pellets of fuel material.

10. The fuel element as claimed in claim 7, wherein the insulating layer consists of both a coating deposited on the inner surface of the cladding (5) and of a coating deposited on the outer surface of the pellets.

11. The fuel element as claimed in claim 7, wherein the cladding (5) is coated on its outer surface with a chromium oxide layer.

* * * * *